United States Patent
Ema

(10) Patent No.: US 6,413,814 B2
(45) Date of Patent: *Jul. 2, 2002

(54) MANUFACTURE OF A SEMICONDUCTOR DEVICE WITH RETROGRADED WELLS

(75) Inventor: Taiji Ema, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/276,795

(22) Filed: Mar. 26, 1999

Related U.S. Application Data

(62) Division of application No. 08/862,878, filed on May 27, 1997.

(30) Foreign Application Priority Data

Dec. 20, 1996 (JP) ............................................... 8-342183

(51) Int. Cl.⁷ .......................................... H01L 21/8242
(52) U.S. Cl. ....................... 438/241; 438/200; 438/232; 438/275; 438/279
(58) Field of Search ................................ 438/275, 279, 438/241, 200, 201, 223, 224, 229, 232

(56) References Cited

U.S. PATENT DOCUMENTS

| | | | |
|---|---|---|---|
| 4,907,058 A | 3/1990 | Sakai | 257/371 |
| 5,374,838 A | 12/1994 | Sawada et al. | 257/371 |
| 5,386,135 A | 1/1995 | Nakazato et al. | 257/371 |
| 5,404,042 A | 4/1995 | Okumura et al. | 257/371 |
| 5,428,239 A | 6/1995 | Okumura et al. | 257/371 |
| 5,514,889 A | 5/1996 | Cho et al. | 257/371 |

FOREIGN PATENT DOCUMENTS

| | | |
|---|---|---|
| JP | 4-212453 A | 8/1992 |
| JP | 6-61486 A | 3/1994 |
| JP | 6-151731 A | 5/1994 |
| JP | 07142605 A | 6/1995 |
| JP | 07183393 A | 7/1995 |
| JP | 08097378 A | 4/1996 |

OTHER PUBLICATIONS

"Well Concentration: A Novel Scaling Limitation Factor Derived from DRAM Retention Time and its Modeling", by T. Hamamoto et al., 0–7803–2700–4, IEEE 1995 (IEDM 95–915).

Primary Examiner—Chandra Chaudhari
Assistant Examiner—Jack Chen
(74) Attorney, Agent, or Firm—Armstrong, Westerman & Hattori, LLP.

(57) ABSTRACT

A DRAM semiconductor device has: a semiconductor substrate with one surface; a first well and a second well respectively formed in a first region and a second region in areas of the one surface of the semiconductor substrate, the first and second wells each having a local maximum of a first conductivity type impurity concentration at a depth position apart from the one surface of the semiconductor substrate, and one of a depth and the first conductivity type impurity concentration of the local maximum of the second well is larger than that of the first well, and the other is at least equal to that of the first well; a memory cell formed in the first well; and a peripheral circuit for the memory cell formed in the second well. A DRAM semiconductor device is provided whose refresh characteristics are improved without deteriorating other characteristics.

7 Claims, 11 Drawing Sheets

MANUFACTURE OF A SEMICONDUCTOR DEVICE WITH RETROGRADED WELLS

This application is a Division of prior application Ser. No. 08/862,878 filed May 27, 1997.

This application is based on a Japanese patent application No. Hei 8-342183, filed on Dec. 20, 1996, the whole contents of which are incorporated herein by reference.

BACKGROUND OF THE INVENTION a) Field of the Invention

The present invention relates to a semiconductor device and its manufacture method, and more particularly to a semiconductor device with dynamic random access memories (DRAMs) and its manufacture method.

b) Description of the Related Art

DRAMs are widely used as storage devices. The application fields of DRAMs are expanding to portable electronic apparatuses, and there is a great need for low power consumption of DRAMs. The capacity of a battery housed in a portable electronic apparatus is limited so that the less the storage device consumes power, the better.

It is necessary for a DRAM to rewrite its data at a predetermined time interval. The memory cell of a DRAM generally has one transistor and one capacitor. Electric charges stored in the capacitor indicate the contents of stored data. One electrode of the capacitor is connected to one electrode (storage node) of the transistor, and the stored charges gradually reduce because of leak current from the storage node.

In order to recover the reduced, stored charges, the data is required to be rewritten. This data rewrite operation is called a refresh operation. If the refresh period is short, the power consumption becomes large. In order to reduce this power consumption, it is efficient to prolong the period of the refresh operation. To this end, it is desired to improve the data retention characteristics (refresh characteristics) of a storage node.

The refresh characteristics are deteriorated by junction leak current flowing out of a diffusion layer which forms part of the storage node of the memory cell, and dominantly affected by defects caused by contamination during the manufacture processes or other reasons. There are many presumable reasons but they are not still definitely decided to be actual reasons.

According to a report of IEDM95 (1995), pp. 915–918, a retention (holding) time of DRAM is largely dependent upon the impurity concentration of a well in which the DRAM cell is formed, and the higher the well impurity concentration, the worse the refresh characteristics. This report analyzes that as the well concentration is raised, thermal ion field emission (TFE) current increases and forms a tail distribution of the retention time.

Techniques of forming DRAMs by using a retrograde triple well has been proposed (for example, U.S. Pat. No. 5,404,042 and JP-A 8-97378, which are incorporated herein by reference). The triple well is a combination of a double well, and complementary single or simple wells. The double well of the triple well structure is also called a triple well, implying that it is accompanied with a simple well of the same conductivity type. A retrograde well is a well having a maximum impurity concentration at a deep position in the well.

If a memory cell is implemented in a retrograde well formed as the inner well of the double well constituting the triple well, the memory cell becomes very resistant to a-ray soft errors. The manufacture process of a retrograde well, using high energy ion implantation, is simple and manufacture cost can be lowered. In addition, resistance to latch-up is excellent in a retrograde well.

FIGS. 10A–10E are cross sectional views illustrating a conventional method of manufacturing DRAMs using the retrograde well.

As shown in FIG. 10A, the surface of a p-type silicon substrate 101 is oxidized to grow a silicon oxide film (buffer film) 130 to a thickness of 3 nm. A silicon nitride film 131 is deposited 115 nm thick on the silicon oxide film 130 by CVD. The silicon nitride film 131 is patterned through photolithography using a resist mask.

Thereafter, a photoresist mask 123b is formed which has openings in the areas corresponding to n-type wells to be next formed. Phosphorous ions are implanted at an acceleration energy of 180 keV and at a dose of $1.4 \times 10^{13}$ cm$^{-2}$ to form n-type regions 102a and 102b. After the photoresist mask 123b is removed, the substrate is subjected to heat treatment for 90 minutes at 1150° C. to form deep n-type wells 102a and 102b.

As shown in FIG. 10B, by using the patterned silicon nitride film 131 as a mask, wet oxidation is performed at 1100° C. to selectively grow field oxide films 125 of 350 nm thickness on the silicon substrate. Thereafter, the silicon nitride film 131 and silicon oxide buffer film 130 are removed. Dry oxidation is performed at 900° C. to grow silicon oxide films (not shown) of 10 nm thickness in the areas where the field oxide films 125 are not formed.

As shown in FIG. 10C, a photoresist mask 123c is formed. This photoresist mask 123c has openings which expose a partial area of the exposed surface of the p-type silicon substrate 101 and a partial area of the n-type well 102b. Boron ions are implanted to form p-type regions 104 and 103. Ion implantation is performed three times, at an acceleration energy of 180 keV and a dose of $1.5 \times 10^{13}$ cm$^{-2}$, at an acceleration energy of 100 keV and a dose of $2 \times 10^{12}$ cm$^{-2}$, and at an acceleration energy of 50 keV and a dose of $1 \times 10^{12}$ cm$^{-2}$, respectively.

The ion implantation at the acceleration energy of 180 keV forms a retrograde portion having a high impurity concentration at a bottom portion of the well. The next ion implantation at the acceleration energy of 100 keV sets the threshold value Vt of a parasitic field transistor under the field oxide film 125 higher than a certain value to form a so-called channel stop region. The ion implantation at the acceleration energy of 50 keV interconnects a p-type region finally formed by ion implantation for adjusting a threshold value of n-channel MOS transistors to be formed later and the p-type region formed at the acceleration energy of 100 keV.

Thereafter, the photoresist mask 123c is removed. After the photoresist mask 123c is removed, boron ions are implanted over the whole surface of the substrate at an acceleration energy of 18 keV and a dose of $2 \times 10^{12}$ cm$^{-2}$. This ion implantation sets desired threshold values of p-channel MOS transistors to be formed in the n-type wells 102a and 102b and n-channel MOS transistors to be formed in the p-type well 104 and in a peripheral circuit region 103a in the p-type triple well 103.

As shown in FIG. 10D, a photoresist mask 123d is formed over the semiconductor substrate surface. This photoresist mask 123d has an opening which exposes a memory cell region 103b of the p-type triple well 103. By using the photoresist mask 123d as a mask, boron ions are implanted at an acceleration energy of 18 keV and a dose of $3 \times 10^{12}$ cm$^{-2}$. This ion implantation sets the threshold value Vt of a transfer transistor to be formed in the memory cell region 103b higher than that of a transistor to be formed in the peripheral circuit region 103a. Thereafter, the photoresist mask 123d is removed.

After the photoresist mask 123d is removed, the oxide film of 10 nm thickness formed before the ion implantation processes is removed, and the semiconductor substrate is processed in a dry oxidizing atmosphere at 900° C. to grow a gate oxide film of 10 nm thickness.

FIG. 10E is a schematic diagram showing the triple well structure formed as above. The n-type well 102a and p-type well 104 are used for forming p-channel MOS transistors and n-channel MOS transistors of a peripheral circuit.

The exposed region of the n-type well 102b and the p-type well region 103a in the n-type well 102b are used for forming a CMOS sense amplifier circuit. The p-type well region 103b in the n-type well 102b is used for forming memory cells.

With the ion implantation processes described above, the threshold values of MOS transistors to be formed in respective regions can be regulated or adjusted to desired values. Thereafter, an insulated gate electrode (word line), a source/drain region (bit line), a capacitor, and the like are formed by usual manufacture processes.

The above-described manufacture method has four mask processes in total up to forming the gate oxide film.

DRAMs having an excellent performance can be manufactured by incorporating the triple well structure having a retrograde well. However, it has been found not satisfactory in that a DRAM circuit is associated with other problems if the refresh characteristics are intended to be improved further.

SUMMARY OF THE INVENTION

It is an object of the present invention to provide a semiconductor device having improved refresh characteristics without degrading other characteristics.

It is another object of the present invention to provide a DRAM semiconductor device having memory cells and peripheral circuits excellent in performance.

It is a further object of the present invention to provide a method of efficiently manufacturing such a semiconductor device.

According to one aspect of the present invention, there is provided a semiconductor device comprising: a semiconductor substrate having one surface; a first well and a second well respectively formed in a first region and a second region in areas of the one surface of the semiconductor substrate, the first and second wells each having a local maximum of a first conductivity type impurity concentration at a depth position apart from the one surface of the semiconductor substrate, and one of a depth and the first conductivity type impurity concentration of the local maximum of the second well is larger than that of the first well, and the other is at least equal to that of the first well; a memory cell formed in the first well; and a peripheral circuit for the memory cell formed in the second well.

According to another aspect of the present invention, there is provided a method of manufacturing a semiconductor device, comprising the steps of: defining a memory cell area and a peripheral circuit area on a surface of a semiconductor substrate; forming a first well by implanting first conductivity type impurity ions into the memory cell area a plurality of times and at different acceleration energies, the first well having a first local maximum of a first conductivity type impurity concentration at a first depth position; and forming a second well by implanting first conductivity type impurity ions into the peripheral circuit area a plurality of times and at different acceleration energies, the second well having a second local maximum of the first conductivity type impurity concentration at a second depth position, wherein one of the second depth position and the second local maximum is larger than a corresponding one of the first depth position and the first local maximum, and the other is at least equal to a corresponding one of the first depth position and the first local maximum.

The impurity concentration distributions of a plurality of retrograde wells of the same conductivity type are set differently to provide characteristics suitable for each retrograde well. For the retrograde well in which a memory cell is formed, the impurity concentration distribution is set so that the refresh characteristics are improved. In contrast to the memory cell, transistors in the peripheral circuit area which are applied with high voltage can be made to have a high breakdown voltage and the characteristics of the transistors are prevented from being deteriorated.

Transistors having different characteristics can be efficiently formed in triple well structures having a retrograde well.

The refresh characteristics of a DRAM memory cell can be improved and a breakdown voltage and the like of each transistor in the peripheral circuit can be properly preserved.

DETAILED DESCRIPTION OF THE PREFERRED EMBODIMENTS

Figure 10A:
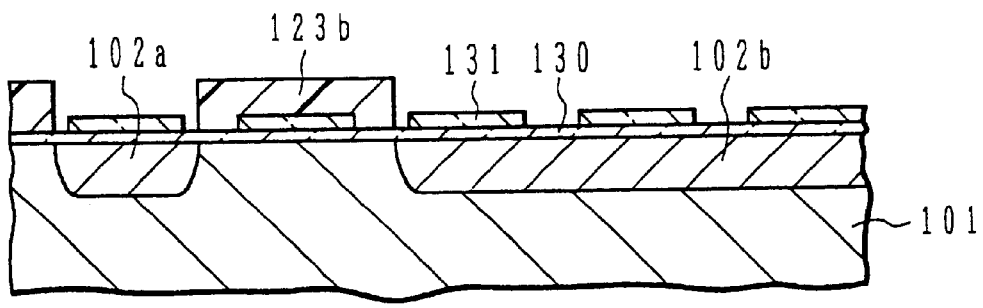
FIGS. 10A–10E are cross sectional views illustrating a conventional triple well forming method.
Figure 10B:
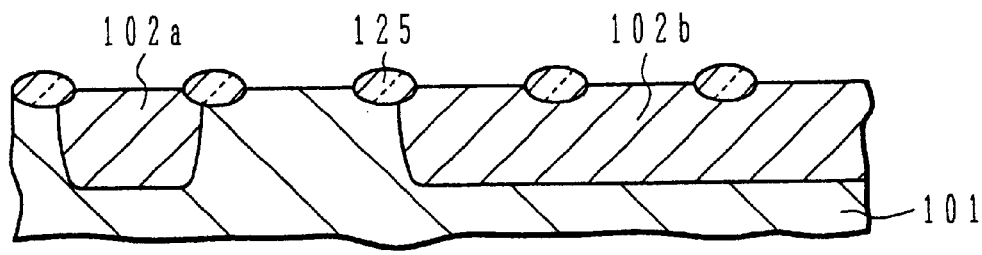
Figure 10C:
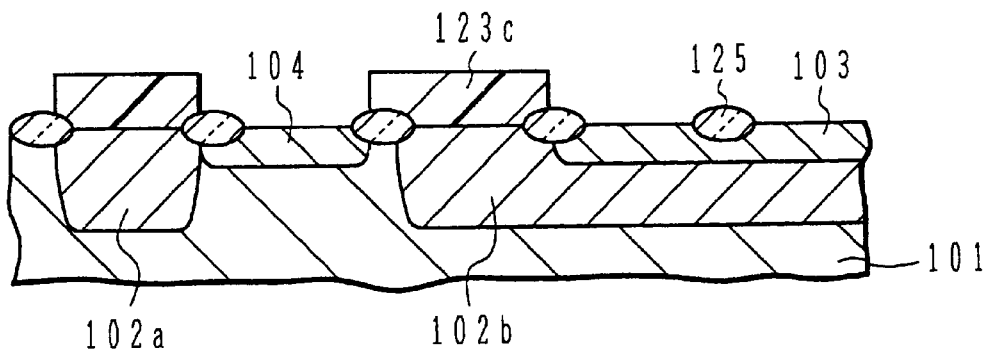
Figure 10D:
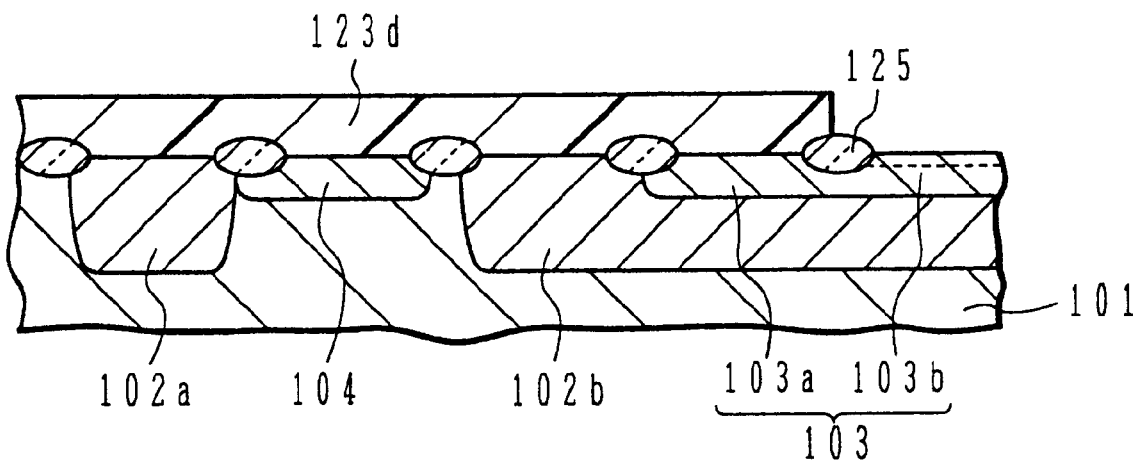
Figure 10E:
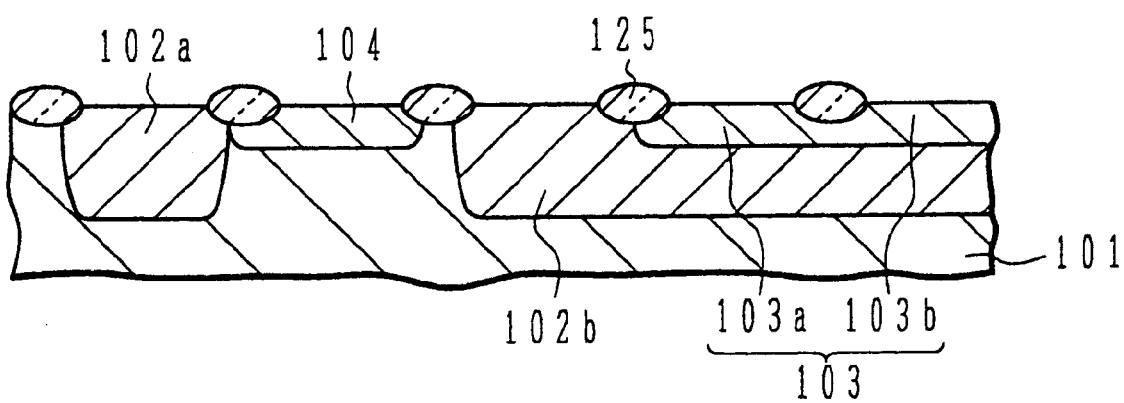

In the triple well shown in FIG. 10E, if the retrograde well is used as the inner well of the double well, DRAMs having excellent performance can be formed. High breakdown voltage transistors are sometimes formed in the peripheral circuit region of the retrograde well 103. Changes in the characteristics of MOS transistors formed in the retrograde well were studied by changing the conditions of implanting boron ions a plurality times to form the retrograde well.

Figure 8A:
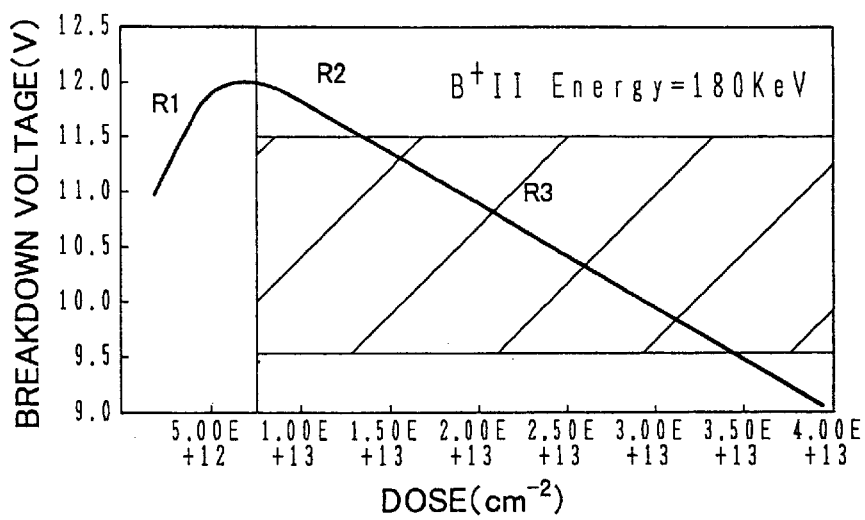
FIGS. 8A–8C are graphs showing the evaluation results of the breakdown voltage characteristics of transistors formed in triple wells, and a cross sectional diagram illustrating breakdown of a transistor.
Figure 8B:
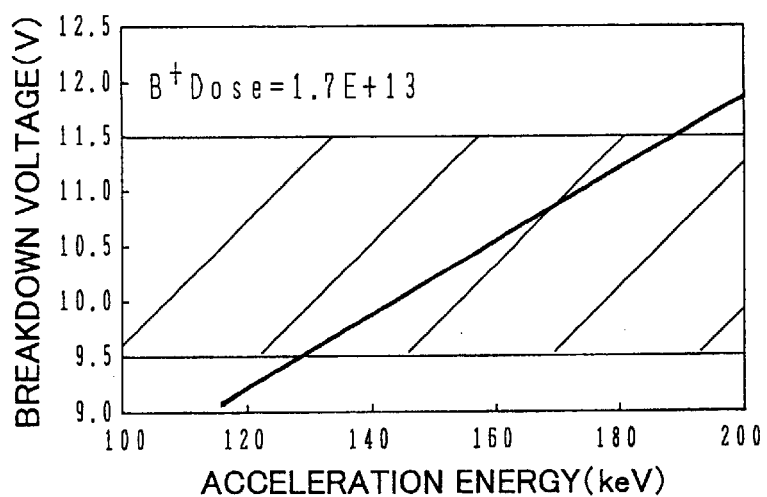

FIGS. 8A and 8B are graphs showing changes in the breakdown voltage with the conditions of boron ion implantation at the highest acceleration energy. In FIG. 8A, the abscissa represents a dose and the ordinate represents a breakdown voltage. In FIG. 8B, the abscissa represents an acceleration energy and the ordinate represents a breakdown voltage.

As seen from FIG. 8A, the breakdown voltage generally linearly lowers in proportion to a dose of ions at the highest acceleration energy.

As seen from FIG. 8B, as the highest acceleration energy of boron ion implantation is increased, the breakdown voltage rises linearly. These results show that it is preferable to perform ion implantation at the highest acceleration energy at a low dose and to raise the highest acceleration energy, in order to obtain a high breakdown voltage.

However, even if the breakdown voltage is set high, the transistor characteristics are deteriorated after actual breakdown. On the other hand, if the breakdown voltage is set low, the transistor characteristics are not deteriorated even after actual breakdown.

Figure 8C:
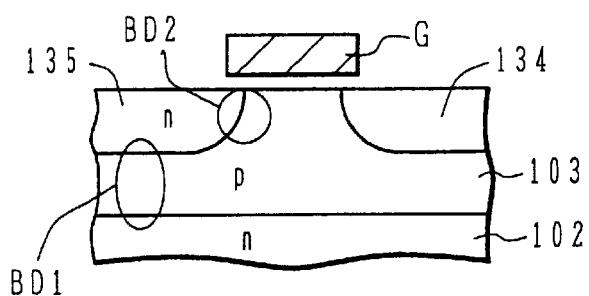

FIG. 8C is a schematic diagram to be used for the analysis of the relationship between the breakdown voltage and deterioration of the transistor characteristics. An n-type well 102 has therein a retrograde p-type well 103 on the surface of which an insulated gate electrode G is formed. The gate electrode G is accompanied with source/drain regions 134 and 135 on both sides thereof.

Under the conditions (region R3 in FIG. 8A) that the Impurity concentration of ions implanted at the highest acceleration energy is large and the breakdown voltage is not so high, breakdown occurs at the interface between the drain region 135 and the region just under the drain region in which ions were implanted at the highest acceleration energy. In this case, electron/hole pairs generated by the breakdown are considered to be absorbed in the n- and p-type regions and not reaching near the gate electrode. However, under the conditions (region R1 in FIG. 8A) that the dose of ions implanted at the highest acceleration energy is small, breakdown punches through between the drain region 135 and the n-type well 102 and it is considered that electron/hole pairs are not generated.

It can be considered that as the breakdown voltage is raised by adjusting the conditions of implanting ions at the highest acceleration energy, the area where breakdown occurs moves from an area BD1 under the drain region to an area BD2 near the gate electrode (region R2 in FIG. 8A). If breakdown occurs in the area BD2, electron/hole pairs generated by the breakdown enter also the gate insulating film and the transistor characteristics are presumably deteriorated.

In order to obtain a high breakdown voltage and not to deteriorate the transistor characteristics, it is therefore preferable to set the breakdown voltage in the range of 9.5 V–11.5 V as seen from FIGS. 8A and 8B. In this range, even if breakdown occurs, the transistor characteristics can be prevented from being deteriorated and the breakdown voltage which does not give any significant operation failure can be preserved. The above description is made taking an example for a case where a memory cell and a peripheral circuit are formed in a double well. The above conditions are applicable also to the case wherein only a peripheral circuit is formed in the double well.

In FIG. 10E, n-channel MOS transistors are formed both in the simple p-type well 104 directly formed in the p-type substrate 101 and in the p-type well (triple well) 103 formed in the n-type well 102b in the p-type substrate 101. These transistors are desired to have proper threshold voltages Vt according to their use objects.

Figure 9A:
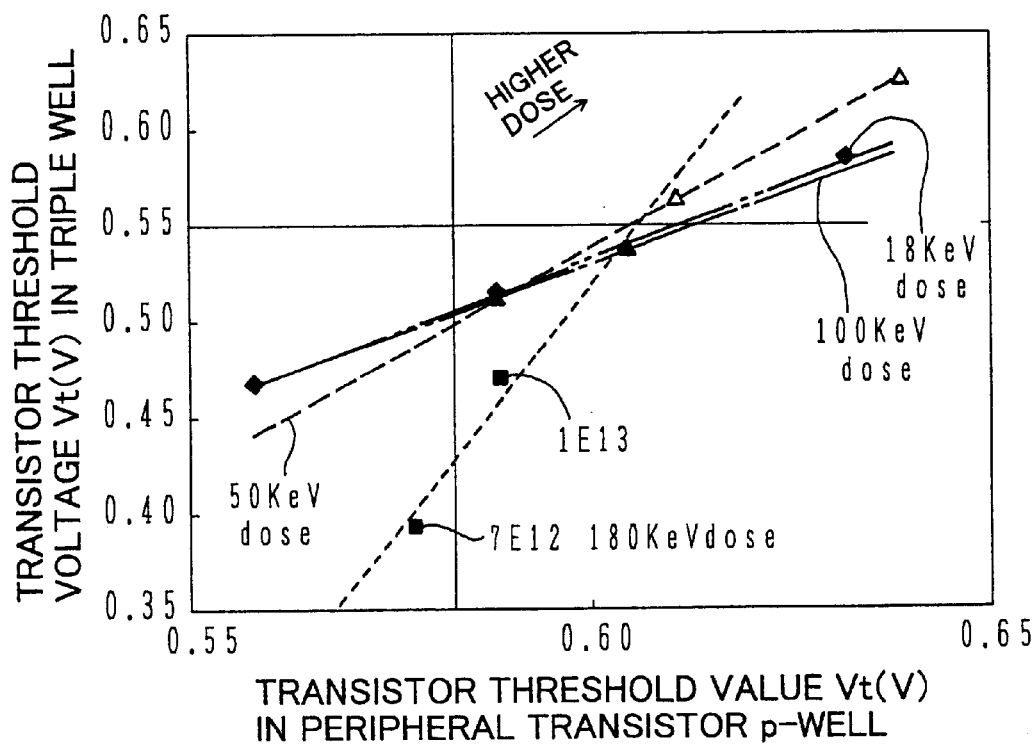
FIGS. 9A and 9B are graphs showing the relationship between threshold values of transistors formed in simple p-type wells and in triple wells and the relationship between refresh times and threshold values of field transistors.

FIG. 9A shows the relationship between the threshold values of transistors formed in a simple p-well and those of transistors formed in an inner well of a double well (triple well). The abscissa represents a threshold value Vt volt (V) of transistors formed in a simple p-well, and the ordinate represents a threshold value Vt volt (V) of transistors formed in a triple p-well. For the formation of p-wells, ion implantation were performed four times at acceleration energies of 180 keV, 100 keV, 50 keV, and 18 keV.

Changes in the transistor threshold values were measured by changing doses of these four ion implantation processes. For the three ion implantation processes at the acceleration energies of 18 keV, 50 keV, and 100 keV, as the dose is increased, the transistor threshold values change in a similar manner and the gradients shown in FIG. 9A are generally the same, although the threshold values rise. Accordingly, as the threshold value of a transistor in the triple p-well is raised, the threshold value of a transistor in the simple p-well is also raised. It is therefore difficult to realize different changes between the triple p-well and the simple p-well.

In contrast to the above three ion implantation processes, the ion implantation at the acceleration energy of 180 keV has a considerably different gradient. Therefore, if it is desired to have a significant difference between the threshold values of transistors in the triple p-well and the simple p-well, it is very efficient to adjust the ion implantation conditions at the highest acceleration energy.

Figure 9B:
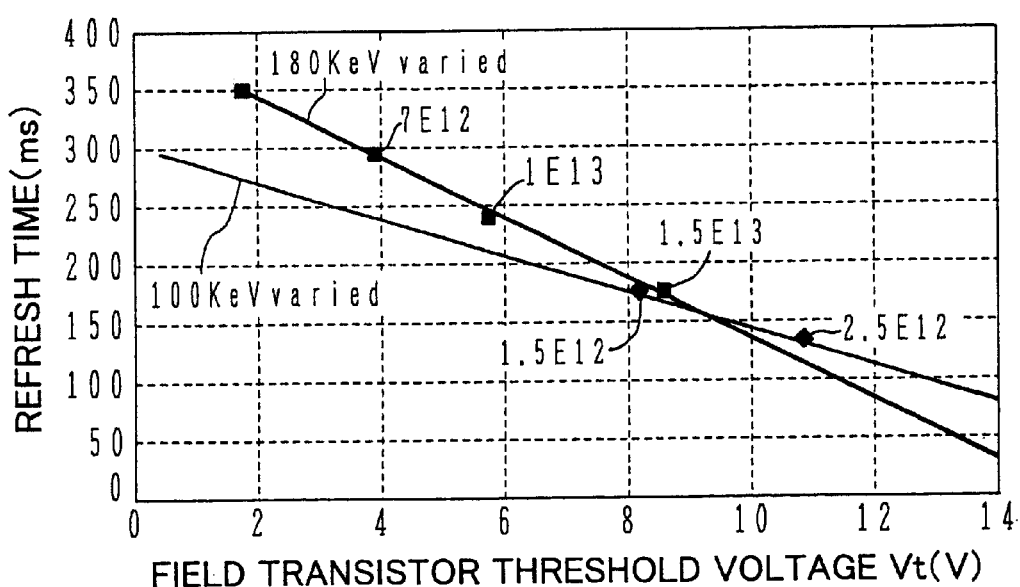

FIG. 9B is a graph showing a change in the refresh time with respect to the threshold value Vt of a field transistor, the graph being obtained by changing the ion implantation conditions at 100 keV and 180 keV which are relatively large acceleration energies among those used for forming the retrograde well. The refresh time prolongs as the dose is reduced, in both the ion implantation processes at the acceleration energies of 100 keV and 180 keV. As the refresh time prolongs, the threshold value of the field transistor lowers. The slope of the characteristic line for the acceleration energy of 180 keV is steeper than that for the acceleration energy of 100 keV. Namely, in order to prolong the refresh time of a memory cell while preserving the high threshold value of the field transistor, it is particularly efficient to reduce the dose at the acceleration energy of 180 keV.

As seen from the experiment results shown in FIGS. 9A and 9B, each of a plurality of ion implantation processes for forming a retrograde well does not equally affects the transistor threshold value and the refresh characteristics, but the ion implantation at the highest acceleration energy affects most, and in order to improve the refresh characteristics, the dose of the ion implantation at the highest acceleration energy should be reduced.

However, this approach of reducing the dose of the ion implantation at the highest acceleration energy has been found unsatisfactory because other problems arise. Of n-channel MOS transistors formed in the peripheral circuit triple well, some transistors operate at a high voltage. In such transistors, punch-through occurs between the n-type drain region and the underlying n-type well (region R1 in FIG. 8A).

Further, the threshold value Vt of an n-channel MOS transistor formed in the triple well lowers and the short channel effect is allowed to become strong. In addition, the threshold values Vt of transistors formed in respective wells become imbalanced (e.g., at point 7E12 of 180 keV ion implantation in FIG. 9A).

Still further, the breakdown voltage of an n-channel MOS transistor is dependent upon the impurity distribution obtained by the ion implantation at the highest acceleration energy, and therefore as the dose is reduced, breakdown occurs at the region BD2 near the gate electrode such as shown in FIG. 8C if an excessively high voltage is applied, deteriorating the transistor characteristics (region R2 in FIG. 8A).

In making breakdown occur in the region BD1 so as not to deteriorate the transistor characteristics, there is a limitation in reduction of the dose of ions implanted at the highest acceleration energy during the formation of the p-type retrograde well. Furthermore, if the impurity concentration in the retrograde well lowers, the latch-up resistance in the peripheral circuit weakens so that the reliability of the whole circuit is degraded.

As above, as both the DRAM memory cell and the peripheral circuit are formed in the retrograde well, it becomes difficult to satisfy both the refresh characteristics of a memory cell and the requirements of a peripheral circuit.

The present inventor has noticed that these problems and their causes emerge from the precondition that the retrograde well for a memory cell and that for a peripheral circuit are formed under the same process conditions. If these retrograde wells can be formed under different process conditions, both the refresh characteristics of a memory cell and the requirements of a peripheral circuit can be satisfied.

However, if the manufacture processes are made too much complicated in order to form two types of retrograde wells, the manufacture cost rises and such retrograde wells become practically difficult to manufacture.

Figure 1A:
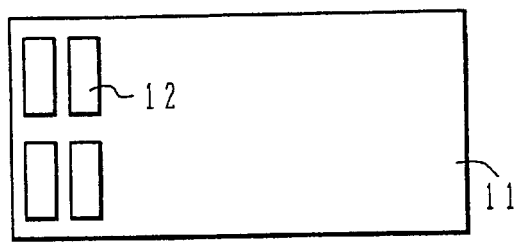
FIGS. 1A–1C are plan views and a cross sectional view showing the structure of a DRAM device according to an embodiment of the invention.
Figure 1B:
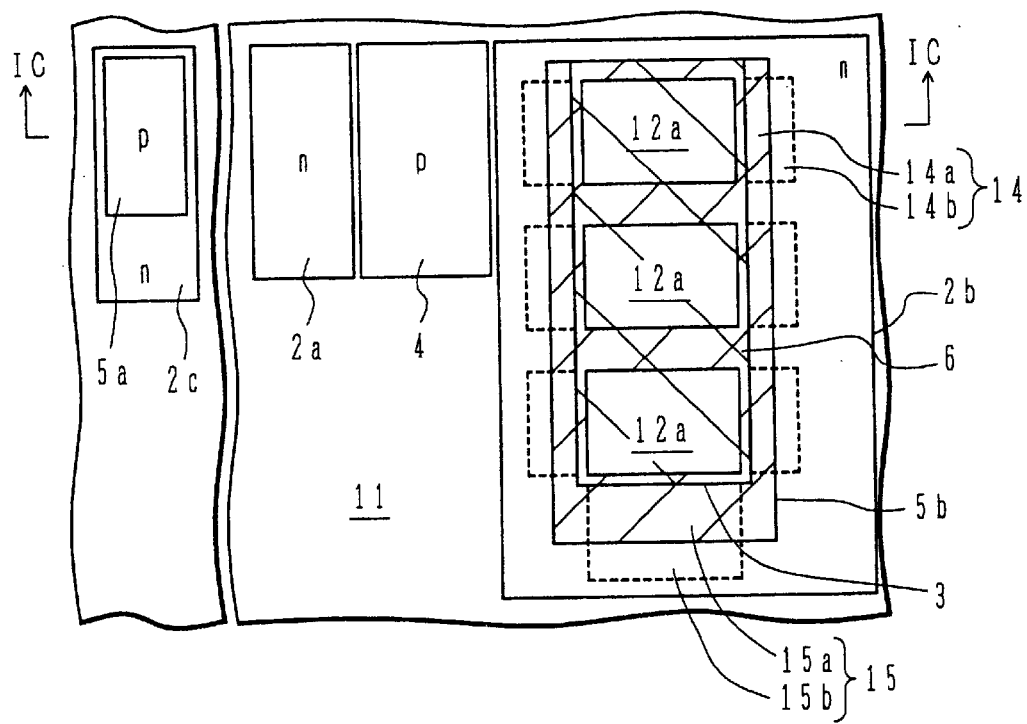
Figure 1C:
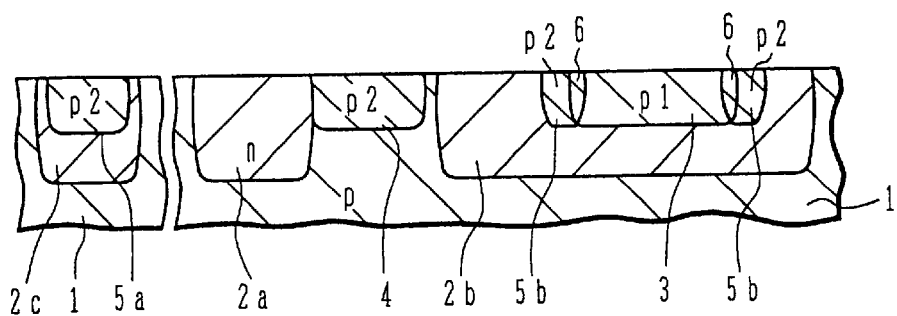

FIGS. 1A–1C schematically show the structure of a DRAM device according to an embodiment of the invention. FIG. 1A is a plan view showing the entirety of a chip, FIG. 1B is a plan view showing one unit of memory cell areas and its nearby peripheral circuit area, and FIG. 1C is a partial cross sectional view of a semiconductor chip.

Referring to FIG. 1A, a plurality of memory cell areas 12 are disposed in a semiconductor chip 11. Peripheral circuit areas are disposed around the memory cell areas 12. Input/output pads (not shown) are disposed at the peripheral area or other areas of the chip 11, and input/output circuits (not shown) are disposed near the pads.

FIG. 1B is a schematic view showing one unit of memory cell areas and its nearby peripheral circuit area. On the surface area of the semiconductor chip 11, an n-type well 2b is formed in which one unit of memory cells is formed. Near the n-type well 2b, a p-type well 4 and an n-type well 2a are formed in which peripheral circuits are formed. A p-type well 5b having apertures 12a therewithin is formed in the n-type well 2b, and another p-type well 3 having no aperture is formed within the outerperiphery of the p-type well 5b. The p-type well 3 does not overlap the p-type well 5b at the memory cell areas 12a, but overlaps it at the outer peripheral areas of the memory cell areas 12a.

In FIG. 1B, the area of the p-type well 5b is indicated by left-down hatched lines and the area of the p-type well 3 is indicated by right-down hatched lines. As a result, the overlap area 6 of the p-type wells 3 and 5b is indicated by cross hatched lines. This overlap area 6 has a high impurity concentration and forms a relatively low resistivity area. Since the memory cell area 12a of a relatively high resistivity is surrounded by the overlap area 6 of the relatively low resistivity, a resistance from each point in the memory cell area 12a to the well bias point of the p-type well can be lowered.

A memory cell is formed in this p-type area 12a. In p-type area 14a and n-type area 14b adjacent to and outside of the p-type well 3, n- and p-channel MOS transistors constituting sense amplifiers are formed. The p-type area 14a and n-type area 14b therefore form a sense amplifier area 14. Similarly, disposed below one unit of memory cells are a p-type area 15a and an n-type area 15b which form a word decoder area 15.

The cross section taken along line IC—IC in FIG. 1B is shown in FIG. 1C. A triple well 2c, 5a is also formed in an area apart from the memory cell areas. The p-type silicon substrate 1 has deep n-type wells 2a, 2b, and 2c. Of these, the n-type wells 2b and 2c have p-type retrograde wells 3, 5a, and 5b.

At the same time when the process of forming these retrograde wells, a simple p-type well 4 is formed in the surface area of the p-type silicon substrate 1. These p-type wells do not have the same p-type impurity concentration, but the p-type impurity concentration at the deepest region is different in the memory cell region and the peripheral circuit region. The p-type impurity concentration at a deep region of the p-type well 3 in which a memory cell is formed has a maximum value of p1, whereas those of the p-type wells 4, 5a, and 5b have a maximum value of p2 (>p1).

For example, a memory cell is formed in the p-type region 3, and a sense amplifier of the peripheral circuit is formed in the n-type region 2b and p-type region 5b. Other peripheral circuits are formed in the n-type wells 2a and 2c and p-type well 4 formed in the p-type silicon substrate 1 and in the retrograde p-type well 5a formed in the n-type well 2c.

The double well structure 2c, 5a containing the retrograde well and formed apart from the memory cell areas shown in FIGS. 1B and 1C has basically the same structure as the double well structure in the memory cell areas (in particular the double well structure 2b, 5b), and so the description of the former structure is omitted hereinunder.

FIGS. 2A–2E illustrate main processes of forming a triple well structure containing a retrograde well according to an embodiment of the invention.

Figure 2A:
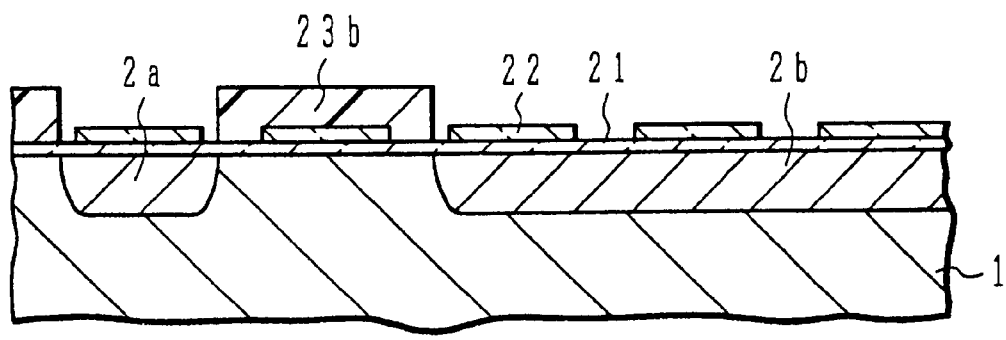
FIGS. 2A–2E are cross sectional views illustrating the processes of forming a triple well structure according to an embodiment of the invention.

As shown in FIG. 2A, the surface of a p-type silicon substrate 1 is oxidized to grow a silicon oxide (buffer) film 21 to a thickness of 3 nm. A silicon nitride film 22 is deposited 115 nm thick on the silicon oxide film 21 by CVD. A photoresist pattern is formed on the silicon nitride film 22, and the nitride film 22 is patterned by photolithography to form a silicon nitride film pattern 22.

A photoresist layer is formed on the semiconductor substrate processed as above, exposed and developed to form a photoresist pattern 23b having openings which expose a p-channel MOS transistor area for peripheral circuits, a triple well area for peripheral circuits, and a memory cell area.

By using this photoresist pattern 23b as a mask, phosphorous ions are implanted at an acceleration energy of 180 keV and at a dose of $1.4 \times 10^{13}$ cm$^{-2}$ to form n-type regions 2a and 2b. At the same time, n-type triple wells for peripheral circuits such as shown in FIG. 1C are formed. After the ion implantation, the photoresist mask 23b is removed.

Figure 2B:
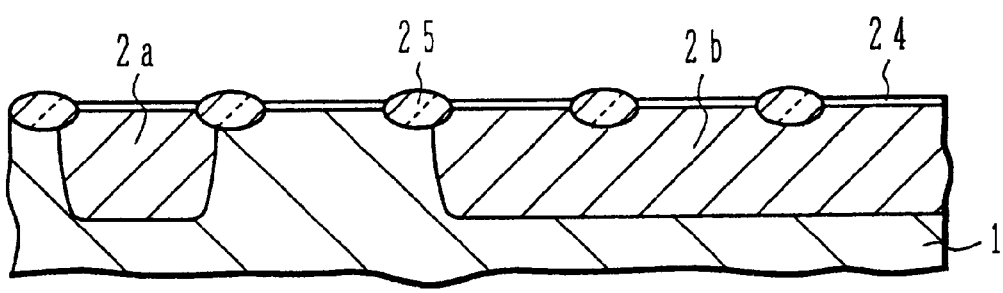

As shown in FIG. 2B, by using the patterned silicon nitride film 22 as a mask, the substrate is subjected to heat treatment for 90 minutes at 1150° C. to form deep n-type wells 2a and 2b. Next, by using the same patterned silicon nitride film 22 as a mask, wet oxidation is performed at 1100° C. to selectively grow field oxide films 25 of 350 nm thickness on the silicon substrate.

After field oxidation, the silicon nitride film 22 and silicon oxide film 21 are removed. Dry oxidation is performed at 900° C. to grow silicon oxide films 24 of 10 nm thickness on the exposed silicon surface. This silicon oxide film 24 is used as a surface protective layer at succeeding ion implantations. This film 24 is not drawn in FIGS. 2C–2E. The above processes are similar to the conventional techniques described with FIGS. 10A–10E.

Figure 2C:
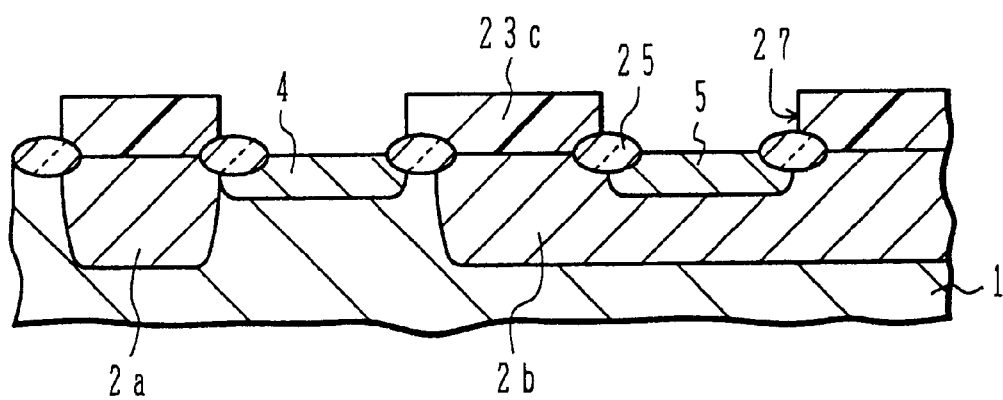

As shown in FIG. 2C, a photoresist mask 23c is formed. This photoresist mask 23c has openings which expose n-channel MOS transistor areas for peripheral circuits. Boron ions are dividedly implanted three times, at an acceleration energy of 180 keV and a dose of $1.5 \times 10^{13}$ cm$^{-2}$, at an acceleration energy of 100 keV and a dose of $2 \times 10^{12}$ cm$^{-2}$, and at an acceleration energy of 50 keV and a dose of $1 \times 10^{12}$ cm$^{-2}$, respectively.

The ion implantation at the acceleration energy of 180 keV forms a retrograde portion having a high concentration at a bottom portion of the p-type well. The dose is set to a value sufficient for making a punch-through voltage between the n-type well 2b and the source/drain region of an n-channel MOS transistor formed in the p-type well have a predetermined voltage or higher, for preventing deterioration of the transistor, and for giving resistance to latch-up.

The dose of the next ion implantation at the acceleration energy of 100 keV is set to a value sufficient for making the threshold value Vt of a parasitic field transistor under the field oxide film 25 have a sufficiently high threshold voltage. A channel stop region is therefore formed by this dose sufficient for setting the threshold value Vt of the field transistor sufficiently high.

The ion implantation at the acceleration energy of 50 keV interconnects an ion doped region finally formed by ion implantation for adjusting a threshold value of n-channel MOS transistors to be formed later and the ion doped region formed at the acceleration energy of 100 keV. This ion implantation at the acceleration energy of 50 keV therefore adjusts the p-type impurity concentration distribution in the depth direction.

Thereafter, the photoresist mask 23c is removed. At this stage, boron ions are implanted over the whole surface of the substrate at an acceleration energy of 18 keV and a dose of $2 \times 10^{12}$ cm$^{-2}$. This ion implantation sets desired threshold values of p-channel MOS transistors to be formed in the n-type wells and of n-channel MOS transistors to be formed in p-type wells for peripheral circuits and in triple wells.

Figure 2D:
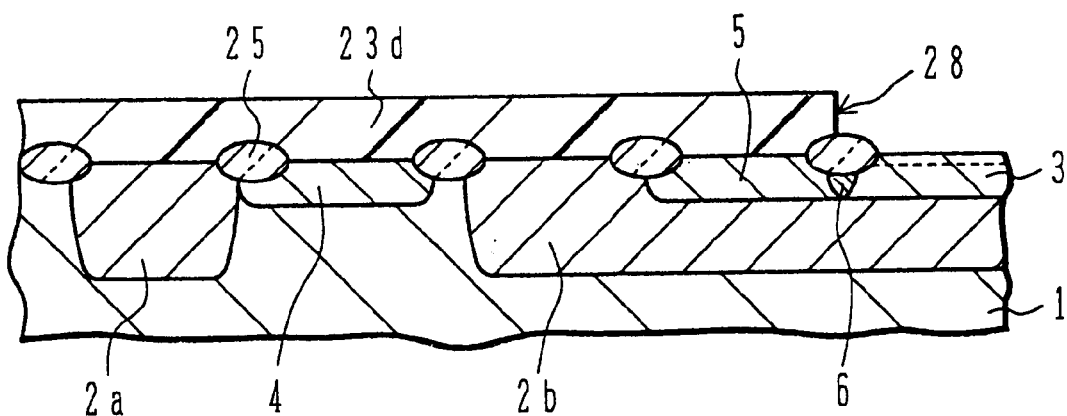

As shown in FIG. 2D, a photoresist mask 23d is formed over the semiconductor substrate surface. This photoresist mask 23d has an opening 28 which exposes only a memory cell area. By using the photoresist mask 23d as a mask, boron ions are implanted to form a triple well 3 for the memory cell area. This ion implantation is dividedly performed four times, at an acceleration energy of 180 keV and a dose of $5 \times 10^{12}$ cm$^{-2}$, at an acceleration energy of 100 keV and a dose of $2-3 \times 10^{12}$ cm$^{-2}$, at an acceleration energy of 50 keV and a dose of $1 \times 10^{12}$ cm$^{-2}$, and at an acceleration energy of 18 keV and a dose of $6-7 \times 10^{12}$ cm$^{-2}$. This ion implantation sets the threshold value Vt of an n-channel transfer MOS transistor in the memory cell area.

Comparison between the two p-type wells 5 and 3 formed in the n-type well 2b is given. The dose at the acceleration energy of 180 keV is $1.5 \times 10^{13}$ cm$^{-2}$ for the peripheral circuit p-type well 5, whereas it is $5 \times 10^{12}$ cm$^{-2}$ for the memory cell p-type well 3. The dose at the highest acceleration energy for forming a retrograde well for the peripheral circuit area is therefore about three times that for the memory cell area.

In order to independently control the characteristics of the memory cell area and the peripheral circuit area, the dose at the highest acceleration energy is preferably set to have at least a 30% difference, based on the dose in the memory cell area. More preferably, the dose for the peripheral circuit area is twice that for the memory cell area, and most preferably three times or higher. These values of the dose are intended to cover the range which is considered equivalent in terms of the characteristics of semiconductor devices.

The dose at the lowest acceleration energy of 18 keV is set as high as $6 \times 10^{12}$ cm$^{-2}$ for the memory cell area as compared to the dose of $2 \times 10^{12}$ cm$^{-2}$ for the peripheral circuit area. The threshold value of a transfer transistor in the memory cell is therefore higher than that of a transistor in the peripheral circuit area. After ions are implanted into the memory cell area, the photoresist mask 23d is removed. Then, the silicon oxide film 24 of 10 nm thickness shown in FIG. 2B is removed.

Figure 2E:
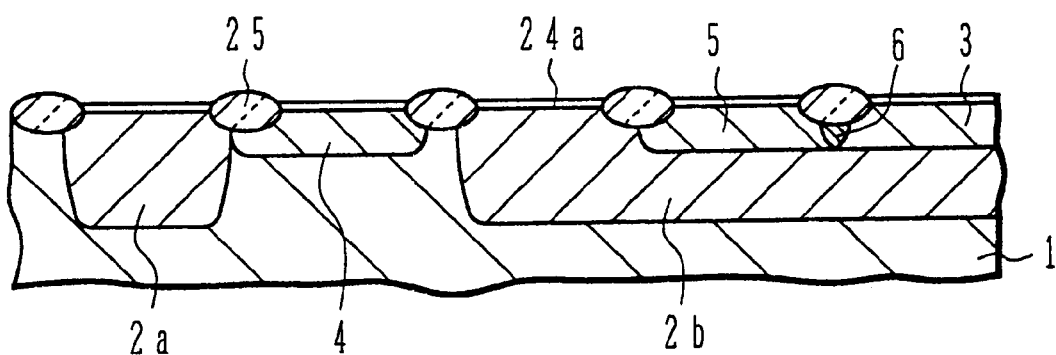

As shown in FIG. 2E, the semiconductor substrate is processed in a dry oxidizing atmosphere at 900° C. to grow a gate oxide film 24a of 10 nm thickness.

Figure 3:
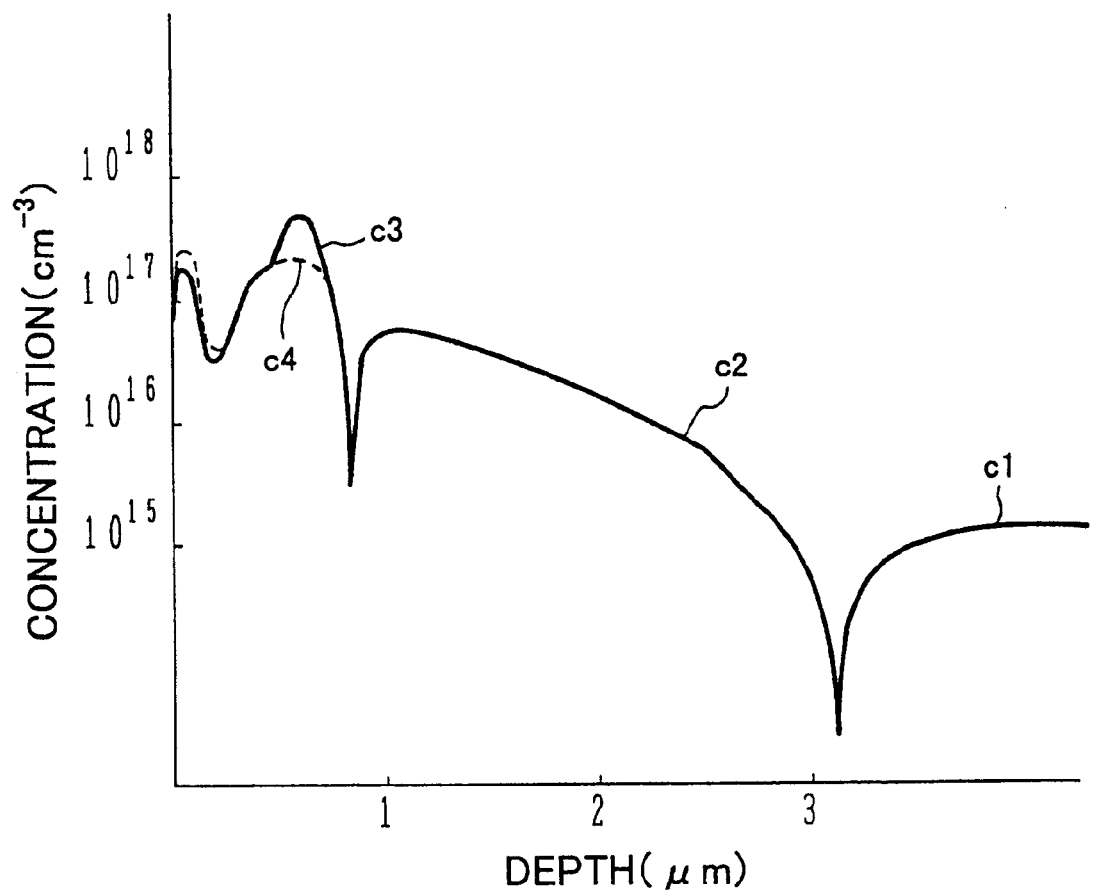
FIG. 3 is a graph showing an example of an impurity concentration distribution of the triple well structure formed by the processes illustrated in FIGS. 2A–2E.

FIG. 3 is a graph showing an impurity concentration distribution in the triple well formed as above. The abscissa represents a depth from the substrate surface in the unit of $\mu$m, and the ordinate represents an impurity concentration in the unit of cm$^{-3}$.

A curve c1 at the deepest region indicates the p-type impurity concentration distribution in the p-type substrate. A curve c2 indicates the n-type impurity concentration distribution in the n-type well 2b which is formed down to a depth of about 3.1 $\mu$m. A curve c3 indicates the p-type impurity concentration distribution in the triple well 5 for the peripheral circuit, and a broken line curve c4 indicates the p-type impurity concentration distribution in the triple well 3 for the memory cell.

In the substrate surface area, the p-type impurity concentration distribution c4 in the memory cell region is higher than the p-type impurity concentration distribution c3 in the peripheral circuit region. At the deep region, a local maximum of the p-type impurity concentration distribution c3 in the peripheral circuit region is higher than that of the p-type impurity concentration distribution c4 in the memory cell region. A depth at the local maximum from the substrate surface is 0.5 to 0.7 $\mu$m. This difference between impurity concentration distributions provides a high threshold value of an n-channel MOS transistor formed in the memory cell area and provides excellent refresh characteristics. The threshold value of an n-channel MOS transistor formed in the peripheral circuit area is low and the breakdown voltage thereof is high, so that latch-up is hard to occur and the short channel effect is not likely to exhibit.

In FIG. 3, the effective impurity concentration is shown which is obtained by compensating (cancelling out) equal amounts of p- and n-type impurities. The concentration of each conductivity type can be estimated easily. The concentration distribution of each conductivity type can be easily estimated and also can be directly measured, for example, through secondary ion mass spectroscopy (SIMS).

Figure 4:
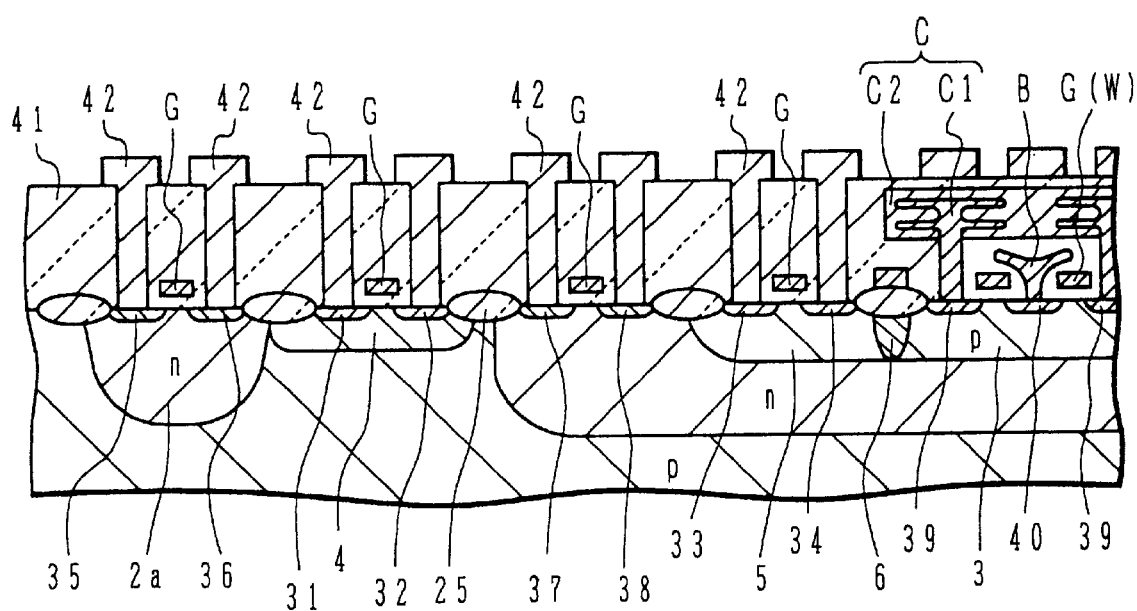
FIG. 4 is a cross sectional view showing an example of the structure of a DRAM device using the triple well structure formed by the processes illustrated in FIGS. 2A–2E.

FIG. 4 is a schematic diagram showing a triple well structure such as shown in FIG. 2E formed with MOS transistors and memory cell capacitors. An insulated gate electrode G is formed on the surface of a substrate, and source/drain regions 30 and 40 are formed on both sides of the gate electrode G.

Source/drain regions 31 to 34 formed in the p-type wells 4 and 5 in the peripheral circuit areas have an lightly doped drain (LDD) structure formed through light and shallow ion implantation and dense and deep (or dense) ion implantation. Source/drain regions 39 and 40 of a transfer transistor formed in the p-type well 3 in the memory cell area are formed only through light and shallow ion implantation. In the triple well 5a for the peripheral circuit shown in FIGS. 1B and 1C, transistors having the same structure as those in the triple well 5b for the peripheral circuit are formed.

An interlayer insulating film 41 is formed covering the insulated gate electrode G. Contact holes are formed in the interlayer insulating film 41 down to the source/drain regions, and electrodes 42 are connected via these contact holes to the source/drain regions.

In the interlayer insulating film 41 in the memory cell area, a bit line B and a capacitor C having a pair of electrodes C1 and C2 are formed. The bit line B is connected to the common source/drain region of a pair of transistors, and the capacitor C is connected to the other source/drain region. The gate electrode G serves also as a word line W.

Although the overlap area 6 of the p-type wells 3 and 5 is disposed under the field oxide film in FIG.4, this area 6 may also be utilized as an active region. A transistor or transistors having a high threshold voltage can be formed in such an active region with higher impurity concentration, and be used in a peripheral circuit. Such a transistor, for example, may be used only for cutting the power supply, with a merit that the leak current in the stand-by state can be reduced.

Figure 5A:
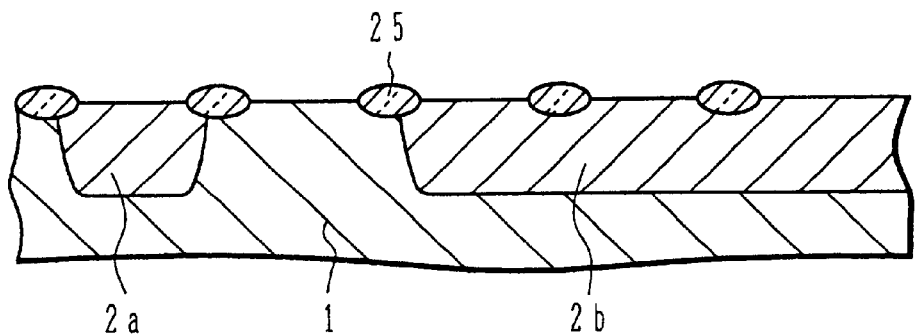
FIGS. 5A–5C are cross sectional views illustrating the processes of forming a triple well structure according to another embodiment of the invention.
Figure 5B:
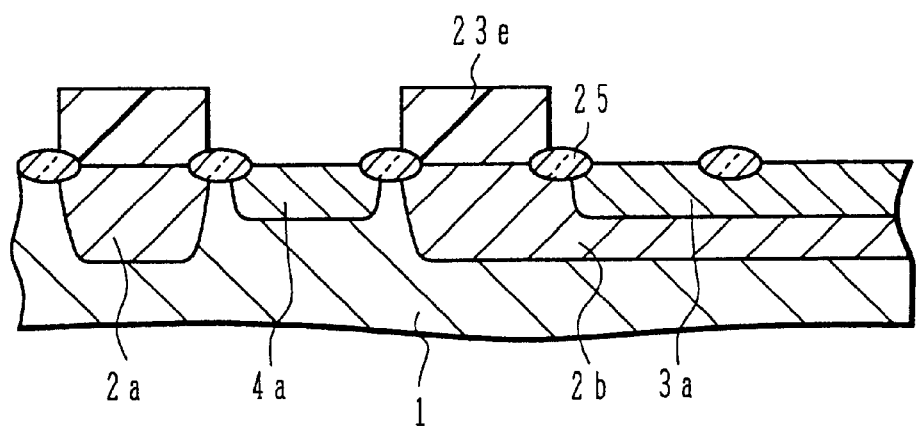
Figure 5C:
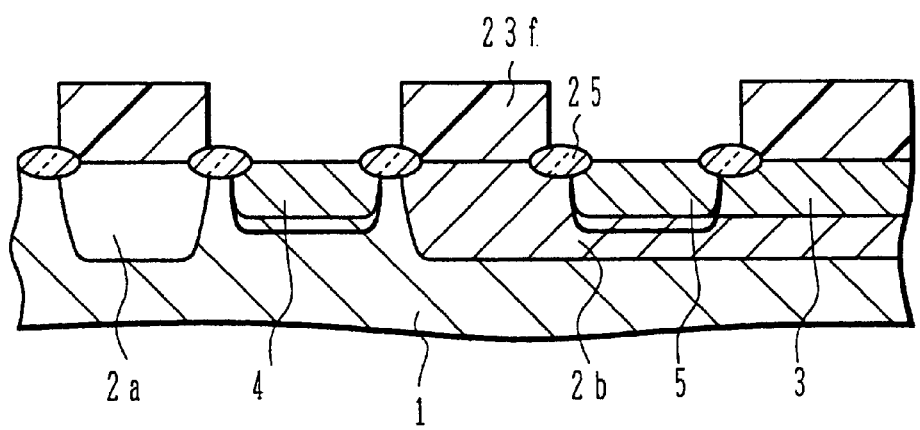

FIGS. 5A–5C are cross sectional views illustrating manufacture processes for forming a triple well structure according to another embodiment of the invention. FIG. 5A shows the structure obtained by processes equivalent to those described with FIGS. 2A and 2B. In a p-type silicon substrate 1, n-type wells 2a and 2b are formed.

Thereafter, as shown in FIG. 5B, a resist mask 23e is formed which has openings exposing a p-type well for peripheral circuits, a triple well for the peripheral circuits, and a triple well for a memory cell. Boron ions are implanted in a three-step process to form p-type retrograde wells, first at an acceleration energy of 180 keV and a dose of $5 \times 10^{12}$ cm$^{-2}$, next at an acceleration energy of 100 keV and a dose of $2–3 \times 10^{12}$ cm$^{-2}$, and lastly at an acceleration energy of 50 keV and a dose of $1 \times 10^{12}$ cm$^{-2}$. The doses at the relatively low acceleration energies of 100 keV and 50 keV are the same as the embodiment shown in FIGS. 2A–2E. The dose at the highest acceleration energy of 180 keV is set to a value suitable for forming the final memory cell region.

After these ion implantations, the photoresist mask 23e is removed, and ions for adjusting the threshold values are implanted over the whole surface of the substrate.

Next, as shown in FIG. 5C, a photoresist mask 23f is formed which has openings exposing the p-type well and triple wells for the peripheral circuits. By using this photoresist mask 23f as an ion implantation mask, boron ions are implanted at an acceleration energy of 180 keV and a dose of $1 \times 10^{13}$ cm$^{-2}$. In this manner, boron ions of the total dose of $1.5 \times 10^{13}$ cm$^{-2}$ including the dose at the ion implantation of FIG. 5B are implanted into the p-type wells 4 and 5 for the peripheral circuits to the deep regions thereof at the acceleration energy of 180 keV. The final triple well structure is therefore the same as that of the embodiment shown in FIGS. 2A–2E. After this ion implantation, the resist mask 23f is removed hereafter, ions are implanted at the acceleration energy of 18 keV only into the memory cell region similar to conventional techniques.

Figure 6:
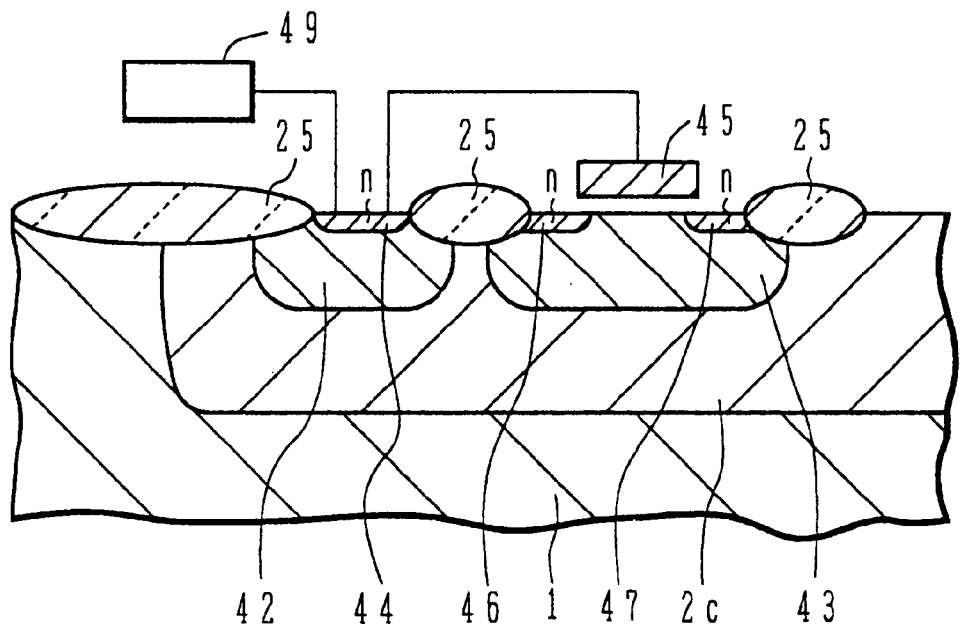
FIG. 6 is a cross sectional view showing an example of the structure of a peripheral circuit according to an embodiment of the invention.

FIG. 6 shows the structure of an input/output circuit as an example of a peripheral circuit formed in the area apart from the memory cell area. A deep n-type well 2c is formed in a p-type silicon substrate 1, and retrograde p-type wells 42 and 43 are formed in this n-type well 2c.

In the p-type well 42, an n-type region 44 is formed to constitute a protective diode. An insulated gate electrode 45 is formed on the other p-type well 43, and n-type source/drain regions 46 and 47 are formed both sides of the insulated gate electrode 45. An input gate MOS transistor is therefore formed. A wiring from an input/output pad 49 is connected to the n-type region 44 of th protective diode and to the insulated gate electrode 45 of th input gate.

Since the protective diode is formed in the n-type well 2c, it can be electrically separated from the substrate. Therefore, even if minus noises enter from the input/output pad 49, noise current can be prevented from flowing into the substrate. Since well 42 is electrically separated from the substrate 1, a desired minus bias can be applied thereto.

Even if minus noises enter from the input/output pad 49 and the protective diode is forward biased, electrons injected from the n-type region 44 to the p-type well 42 are absorbed and do not affect other transistors.

If plus noises enter from the input/output pad 49 and the impurity concentration of the p-type well 42 is small and the depth is shallow, the whole of the p-type well 42 is depleted so that punch-through easily occurs. In order to prevent punch-through of the p-type well 42, it is desired to set high the p-type impurity concentration in the deepest region of the retrograde p-type well 42. The triple well structure of the above embodiments can set high the p-type impurity concentration at a bottom portion of the triple well for the peripheral circuit so that the above problem can be easily solved.

Figure 7:
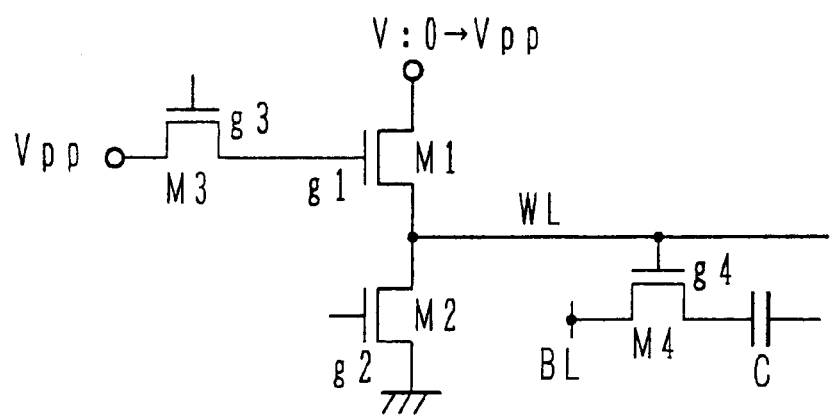
FIG. 7 a circuit diagram showing an example of a peripheral circuit according to an embodiment of the invention.

FIG. 7 shows an example of a word line drive circuit. A transistor M4 and a capacitor C constitute one memory cell. A word line WL is connected to the gate g4 of the transistor M4. The source of the transistor M4 is connected to the bit line BL.

Transistors M1 and M2 are both made of n-channel MOS transistors and operate to apply a desired voltage to the word line WL. The transistors M1 and M2 are serially connected between a variable voltage V and a ground potential. The gate electrode g1 of the transistor M1 is connected via a transistor M3 to a pumping voltage source $V_{PP}=V_{CC}+\alpha$.

The operation of this circuit will be briefly described. First, the variable voltage V is set to 0 and the transistor M3 is turned on to apply $V_{PP}$ to the gate g1 of the transistor M1. Then, the transistor M3 is turned off. At this time, the potential of the gate g1 of the transistor M1 is $V_{PP}$.

Thereafter, as the variable voltage V at the transistor M1 is raised from 0 to $V_{PP}$, the potential at the gate electrode g1 rises and takes a value $V_{PP}+\Delta V$ because of the parasitic capacitance between the gate electrode g1 and the source/drain region. This raised gate voltage is sufficient to turn on the transistor M1. Therefore, the potential at the node connected to the word line WL rises to $V_{PP}$. In this manner, a sufficiently high voltage $V_{PP}$ is supplied to the word line WL. A reset voltage is applied to the gate g2 of the transistor M2.

When the potential of the gate electrode g1 of the transistor M1 rises to $V_{PP}+\Delta V$, this voltage is also applied to the drain region of the transistor M3. Therefore, this transistor M3 requires a high breakdown voltage.

The transistors M1, M2, and M3 are formed in the triple well structure for the peripheral circuit such as shown in FIG. 6. The transistor M4 is formed in the memory cell area. Since the p-type impurity concentration distribution in the peripheral circuit triple well can be set separately from that in the memory cell p-type triple well, a high breakdown voltage transistor for the peripheral circuit can be efficiently formed while setting a memory cell refresh time to an optimum value.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device, comprising the steps of:

defining a memory cell area and a peripheral circuit area on a surface of a semiconductor substrate, forming a first well by implanting first conductivity type impurity ions into the memory cell area a plurality of times and at different acceleration energies, the first well having a first local maximum of a first conductivity type impurity concentration at a first depth position apart from the surface of the semiconductor substrate; and forming a second well by implanting first conductivity type impurity ions into the peripheral circuit area a plurality of times and at different acceleration energies, the second well having a second local maximum of the first conductivity type impurity concentration at a second depth position apart from the surface of the semiconductor substrate, wherein a dose of a highest acceleration energy ion implantation of said different acceleration energies is higher in the peripheral circuit area than in the memory cell area, and the impurity concentration of the second local maximum is larger than the impurity concentration of the first local maximum.

2. A method according to claim 1, wherein:

said step of forming the first well includes the step of implanting ions by using a first mask having an opening in an area corresponding to the memory cell area, and said step of forming the second well includes the step of implanting ions by using a second mask having an opening in an area corresponding to the peripheral circuit area.

3. A method according to claim 2, wherein the opening of the first mask and the opening of the second mask have a partially overlapped area.

4. A method according to claim 3, wherein a resultant peripheral circuit area surrounds a resultant memory cell area.

5. A method according to claim 2, wherein the first mask also has an opening in an area corresponding to the peripheral circuit area and said step of forming the first well also serves as part of said step of forming the second well.

6. A method according to claim 1, wherein the acceleration energies for the plurality of ion implantations in said step of forming the first well are the same as the acceleration energies for the plurality of ion implantations in said step of forming the second well.

7. A method according to claim 1, further comprising the step for forming a third well by implanting impurity ions of a second conductivity type opposite to the first conductivity type into an area covering the first and second wells, prior to said defining step.

* * * * *